(12) United States Patent
Lopez de Arroyabe

(10) Patent No.: US 9,925,880 B2
(45) Date of Patent: Mar. 27, 2018

(54) VEHICLE WITH POWER ELECTRONICS

(71) Applicant: Bayerische Motoren Werke Aktiengesellschaft, Munich (DE)

(72) Inventor: Jose Lopez de Arroyabe, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 581 days.

(21) Appl. No.: 14/176,483

(22) Filed: Feb. 10, 2014

(65) Prior Publication Data

US 2014/0152092 A1 Jun. 5, 2014

Related U.S. Application Data

(63) Continuation of application No. PCT/EP2012/065135, filed on Aug. 2, 2012.

(30) Foreign Application Priority Data

Aug. 12, 2011 (DE) .......................... 10 2011 080 912

(51) Int. Cl.
  *B60L 11/18* (2006.01)
  *B60L 15/00* (2006.01)
  (Continued)

(52) U.S. Cl.
  CPC ......... *B60L 11/1803* (2013.01); *B60L 15/007* (2013.01); *B60L 15/20* (2013.01);
  (Continued)

(58) Field of Classification Search
  CPC ........................... B60L 11/1803; H05K 1/144
  See application file for complete search history.

(56) References Cited

U.S. PATENT DOCUMENTS

| 7,006,356 B2 | 2/2006 | Bergmann et al. |
| 2004/0066643 A1 | 4/2004 | Beihoff et al. |
| (Continued) | | |

FOREIGN PATENT DOCUMENTS

| DE | 102 20 047 A1 | 11/2003 |
| DE | 20 2010 006 280 U1 | 9/2010 |
| (Continued) | | |

OTHER PUBLICATIONS

English translation of International Preliminary Report on Patentability (PCT/IB/373) with Written Opinion (PCT/ISA/237) dated Feb. 27, 2014 (Nine (9) pages).
International Search Report (PCT/ISA/210) with English translation thereof dated Jun. 3, 2013 {Seven (7) pages}.
German-language Search Report with partial English translation thereof dated Apr. 27, 2012 {Ten (10) pages}.

*Primary Examiner* — Jeffrey Shin
(74) *Attorney, Agent, or Firm* — Crowell & Moring LLP

(57) ABSTRACT

A vehicle includes a power electronics unit for converting energy between a DC circuit and a polyphase machine, wherein the power electronics unit has a power module, a driver board, and a control board. The power electronics unit has two DC current rails, wherein the DC circuit can be connected to the same, and the power electronics unit has phase current rails, wherein the polyphase machine can be connected to the same. The number of the phase current rails corresponds to the number of the phases of the polyphase machine. The arrangement of the power module, the driver board, and the control board corresponds to a stacked or sandwiched construction, the phase current rails are electrically connected to the power module, and the control board has a passage for each of the phase current rails, wherein one phase current rail is fed through each passage.

6 Claims, 2 Drawing Sheets

(51) Int. Cl.
*H05K 1/14* (2006.01)
*H05K 7/14* (2006.01)
*H05K 1/02* (2006.01)
*B60L 15/20* (2006.01)
*H02P 27/06* (2006.01)
*H02M 7/00* (2006.01)

(52) U.S. Cl.
CPC ........... *H05K 1/0263* (2013.01); *H05K 1/144* (2013.01); *H05K 7/1432* (2013.01); *B60L 2240/429* (2013.01); *B60L 2240/80* (2013.01); *B60L 2270/147* (2013.01); *H02M 7/003* (2013.01); *H02P 27/06* (2013.01); *H05K 2201/041* (2013.01); *H05K 2201/10151* (2013.01); *H05K 2201/10166* (2013.01); *H05K 2201/10272* (2013.01); *Y02T 10/644* (2013.01); *Y02T 10/645* (2013.01); *Y02T 10/7005* (2013.01); *Y02T 10/72* (2013.01); *Y02T 10/7275* (2013.01)

(56) References Cited

U.S. PATENT DOCUMENTS

| | | |
|---|---|---|
| 2008/0205107 A1 | 8/2008 | Hattori et al. |
| 2011/0199800 A1* | 8/2011 | Yahata .................. H02M 7/003 363/131 |
| 2013/0049495 A1* | 2/2013 | Matsuo ................... H02K 5/20 310/53 |

FOREIGN PATENT DOCUMENTS

| | | |
|---|---|---|
| EP | 1 881 592 A2 | 7/2007 |
| JP | 2008-35591 A | 2/2008 |
| JP | 2009-105178 A | 5/2009 |

\* cited by examiner

VEHICLE WITH POWER ELECTRONICS

CROSS REFERENCE TO RELATED APPLICATIONS

This application is a continuation of PCT International Application No. PCT/EP2012/065135, filed Aug. 2, 2012, which claims priority under 35 U.S.C. § 119 from German Patent Application No. 10 2011 080 912.0, filed Aug. 12, 2011, the entire disclosures of which are herein expressly incorporated by reference.

BACKGROUND AND SUMMARY OF THE INVENTION

The invention relates to a vehicle having a power electronics unit for the purpose of converting energy between a direct current (DC) circuit and a polyphase machine, wherein the power electronics unit has a power module, a driver circuit board, and a control circuit board. The power electronics unit has two DC current rails, wherein the DC circuit can be connected to the same. The power electronics unit has phase current rails, wherein the polyphase machine can be connected to the same, wherein the number of the phase current rails corresponds to the number of the phases of the polyphase machine.

Power electronics components which are used in modern motor vehicles such as hybrid or electric vehicles are subjected to more critical demands compared to stationary applications such as those in industrial and plant settings. This is true, by way of example, of the geometric construction and the constructed space thereof, as well as temperature resistance or the design for short-term operation.

In vehicles with electric drive trains, electric inverters and/or rectifiers are particularly needed as power electronics components, which convert energy between a DC voltage on-board power supply in the high-voltage range, and a polyphase electric machine. In an electrical inverter, electronic semiconductor high-power switches, which are typically IGBTs (insulated-gate bipolar transistors) are used, grouped into a power module similar to an assembled circuit board. In addition, an inverter commonly has a separate driver circuit board via which the voltage control of the gates is carried out. In addition, an inverter has a control circuit board which has a central processor unit (CPU). The operating voltage of the control circuit board is typically in the low-voltage range, while the driver circuit board and the power module are designed for high-voltage.

In the prior art, the power module is connected to current rails for the flow of the alternating current. The current rails are typically equipped with current sensors. An analog measurement signal is commonly transmitted from the current sensors to the CPU of the control circuit board. As is found in the scientific publication DOI 10.1109/ISPSD.2008.4538886, the measurement signal is alternatively processed at the site of the measurement in a more cost-intensive design.

In US 2004/0066643, an arrangement for current rails and metallic shielding plates is used to minimize the interactions between the electronics and the electromagnetic interference fields caused by the switches of the IGBTs.

The problem addressed by the invention is that of describing a vehicle with an improved power electronics unit.

This problem is addressed by a vehicle with a power electronics unit for the purpose of converting energy between a DC circuit and a polyphase machine. The power electronics unit has a power module, a driver circuit board, and a control circuit board. The power electronics unit has two DC power rails, wherein the DC circuit can be connected to the same. The power electronics unit has phase current rails, wherein the polyphase machine can be connected to the same. The number of the phase current rails corresponds to the number of the phases of the polyphase machine. The power module, the driver board, and the control board are arranged together in a stacked construction. The phase current rail can be electrically connected to the power module. The control circuit board has a passage for each of the phase current rails, wherein one phase current rail can be fed through each passage.

According to the invention, the arrangement of the power module, the driver circuit board, and the control circuit board corresponds to a stacked or sandwiched construction, wherein the phase current rails are connected to the power module. In addition, the control circuit board has a passage for each of the phase current rails, through which the phase current rail is fed. In this way, the effect of the phase current rail being arranged at the least possible distance in space from the control circuit board is achieved.

According to one preferred embodiment of the invention, the control circuit board has a current sensor at each passage, and each current sensor measures the current in the respective phase current rail. This provides the particular advantage that the current sensors, which determine the phase current of the electrical machine in the respective phase current rail, can be integrated on the control circuit board due to the arrangement of the phase current rails.

According to a further variant of the invention, the control circuit board has a central processor unit and an analog data link to each of the current sensors. Each current sensor transmits a current measurement signal via the data link which is functionally assigned to the sensor.

The data links are preferably designed as cable connections via which an analog measurement signal is transmitted from each respective current sensor to the central processor unit. In this case, it is particularly advantageous that a length of the cable connection between the current sensor and the central processor unit results from the short distance in space. For this reason, the sensitivity of the current measurement signal to electromagnetic interference is low.

One particular advantage results from the vehicle being designed as an electric or hybrid vehicle. Electric and hybrid vehicles have an electrified drive train in the high-voltage range up to 380 Volts. The drive train must be controlled as precisely as possible due to the great number of operating states and influencing parameters. A nearly interference-free measurement of the phase currents of the electrical machine makes a contribution toward this goal.

The invention is based on the following considerations: in electric and hybrid vehicles, current sensors are used in the power electronics to measure the phase currents of the electrical machine. These current sensors have paramount significance in the regulation of the electrical machine. For this reason, interferences or phase shifts of the current measurement signals coming from the current sensor must be avoided no matter what. By means of a skillful topological arrangement of the circuit boards of the power electronics, it is possible to decisively improve the signal quality. This can be achieved by placing the phase current sensors on the controller board to minimize the conductor path lengths between the current sensor and the analog-to-digital converter of the CPU. For this purpose, the power rails for the individual phases are routed through the controller board. As a result, a potential for saving on material costs and weight arises.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
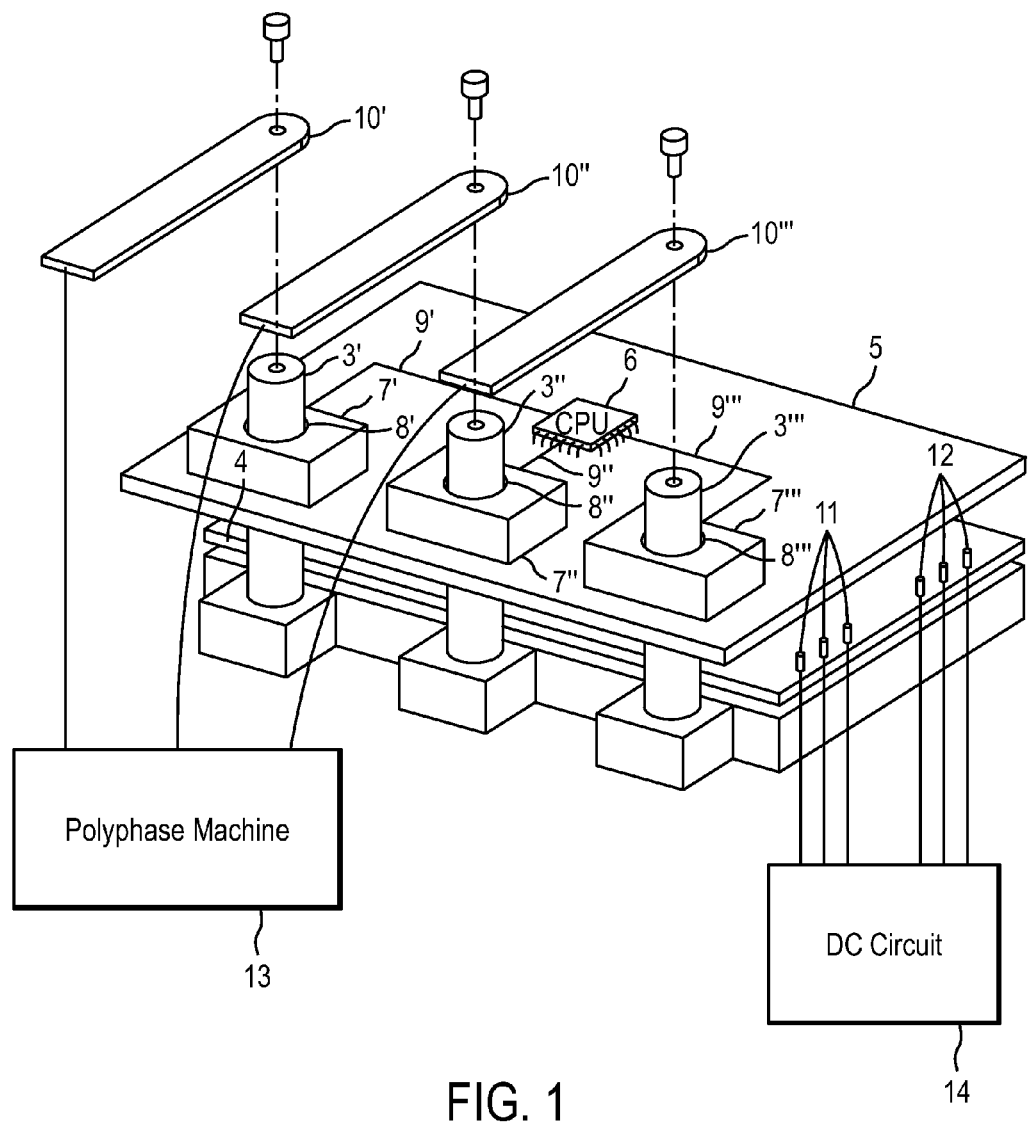
FIG. 1 is a perspective view of a power electronics unit.
Figure 2:
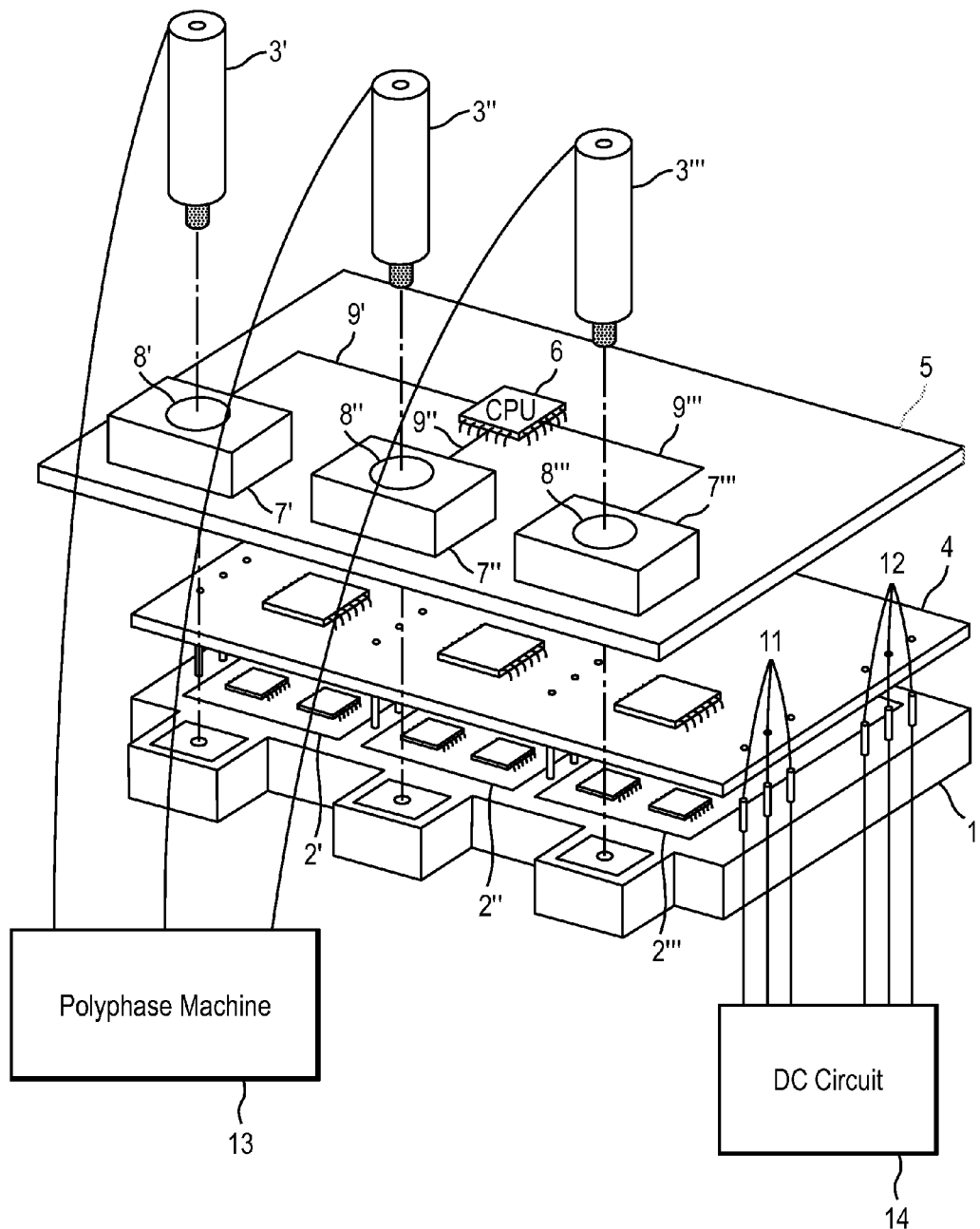
FIG. 2 is an exploded perspective view of the power electronics unit.

FIG. 1 schematically shows a power electronics unit for a motor vehicle. FIG. 2 shows the power electronics unit in an exploded illustration, wherein the reference numbers in FIG. 2 correspond to those in FIG. 1. The power electronics unit is designed, by way of example, as an electronic power inverter for a three-phase electric machine.

Three half-bridges (2', 2", 2') of high-power semiconductor switches (IGBTs-insulated-gate bipolar transistors) and semiconductor diodes are positioned on a board, which is termed the power module (1). Each half-bridge is connected to one phase current rail (3', 3", 3'). The phase current rails can be extended by way of rail extensions (10', 10", 10') in order to establish a conductive connection to an electrical machine, i.e., polyphase machine 13. The gates of the IGBTs are controlled via a driver circuit, which is configured on a driver circuit board (4). Two DC power rails 11 and 12 are provided for connection to the DC circuit 14.

In addition, the power electronics unit has a control circuit board (5) with a central processor (CPU—central processing unit, 6). The control circuit board has recesses through which it is possible to route the phase current rails. The control circuit board can have spacers between the circuit board and the phase current rail passed through the same, in the recesses.

In addition, the control circuit board (5) has current sensors (7', 7", 7') which can be designed as Hall effect sensors, by way of example. The Hall effect sensors likewise have passages (8', 8", 8') through which the phase current rails are routed, in order to enable a current measurement according to the Hall effect principle. The Hall effect sensors are analog sensors and each deliver an analog measurement signal. These measurement signals are each transmitted to the central processor via a conductor path or a cable line (9', 9", 9').

The spatial proximity of the current sensor to the phase current rails has a particularly advantageous effect on the quality of the current measurement signals, because a short path for the data transmission is enabled as a result. In addition, the lines for the transmission of data are situated exclusively on the control circuit board (5).

Compared to the prior art, wherein the spatial distance between the analog current sensors and the CPU of the control board is larger, there is an improved shielding of the lines for the transmission of the analog measurement signal. The electromagnetic interference caused by the switching of the high currents in the IGBT, which leads to an undesired time delay and/or phase shift of the measurement signals which is difficult to verify, is reduced. As such, it is possible to precisely regulate the phase current—meaning the electrical machine—with little cost application and little constructed space for the inverter. This differentiates the embodiment from the prior art, according to which the signals measured by the current sensors are processed at the site of the current measurement. In this case, additional circuit boards are necessary for each current sensor, each having a functionality which is actually provided by one CPU.

In addition, the embodiment is differentiated from the prior art, according to which the signals measured by the current sensor are preferably processed by means of RC filters for the purpose of interference compensation. In the embodiment described in FIG. 1 and FIG. 2, such filters can be dispensed with, or can be implemented with much less complexity than in the prior art.

A further advantage which results from the arrangement according to FIGS. 1 and 2 is the compact construction of the inverter. All of the lines can be kept short, and therefore EMC compatible, for the whole arrangement. This applies not only to the lines used for the transmission of data from the current sensors, but also to the control lines of the IGBTs between the driver circuit board (4) and the power module (1). The IGBT control signals are therefore nearly free of interference, and can be applied with little inherent line inductance. This contributes to very quick and precise control of the IGBTs, and additionally leads to more precise control of the phase currents. The driver of the vehicle then benefits from a particularly smooth driving experience with no jerking, and with fast response behavior of the electric machine. The compact construction, of course, saves materials and space.

According to a further embodiment, the components of the driver circuit board can also be integrated into a section of the control circuit board, such that the driver circuit board positioned between the power module and the control circuit board can be eliminated.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A power electronics unit for a vehicle, the power electronics unit converting energy between a direct current circuit and a polyphase machine, comprising:
   a power module;
   a driver circuit board;
   a control circuit board;
   two direct current power rails, wherein the direct current circuit is connectable to the direct current power rails;
   phase current rails, wherein the polyphase machine is connectable to the phase current rails, with a number of the phase current rails corresponding to a number of phases of the polyphase machine, wherein:
      the power module, the driver circuit board and the control circuit board are arranged in a stacked construction, in which the driver circuit board is stacked between the power module and the control circuit board without any other circuit boards and any plates disposed between the driver circuit board and the power module and without any other circuit boards and any plates disposed between the driver circuit board and the control circuit board,
      the phase current rails are electrically coupleable to the power module, and
      the control circuit board comprises a passage for each of the phase current rails, wherein one phase current rail is feedable through each passage.

2. The power electronics unit according to claim 1, wherein
the control circuit board has one current sensor at each passage, and
each current sensor measures a current in a respective phase current rail extending through the passage.

3. The power electronics unit according to claim 2, wherein
the control circuit board comprises a central processor,
the control circuit board comprises an analog data link arranged between the central processor and each of the current sensors, and
a respective current measurement signal is transmittable by each of the current sensors to the central processor via a respective analog data link.

4. A vehicle, comprising:
a direct current circuit;
a polyphase machine;
a power electronics unit converting energy between the direct current circuit and the polyphase machine, the power electronics unit comprising:
a power module;
a driver circuit board;
a control circuit board;
two direct current power rails, wherein the direct current circuit is connectable to the direct current power rails;
phase current rails, wherein the polyphase machine is connectable to the phase current rails, with a number of the phase current rails corresponding to a number of phases of the polyphase machine, wherein:
the power module, the driver circuit board and the control circuit board are arranged in a stacked construction, in which the driver circuit board is stacked between the power module and the control circuit board without any other circuit boards and any plates disposed between the driver circuit board and the power module and without any other circuit boards and any plates disposed between the driver circuit board and the control circuit board,
the phase current rails are electrically coupleable to the power module, and
the control circuit board comprises a passage for each of the phase current rails, wherein one phase current rail is feedable through each passage.

5. The vehicle according to claim 4, wherein
the control circuit board has one current sensor at each passage, and
each current sensor measures a current in a respective phase current rail extending through the passage.

6. The vehicle according to claim 5, wherein
the control circuit board comprises a central processor,
the control circuit board comprises an analog data link arranged between the central processor and each of the current sensors, and
a respective current measurement signal is transmittable by each of the current sensors to the central processor via a respective analog data link.

\* \* \* \* \*